(12) United States Patent
Nam et al.

(10) Patent No.: US 6,226,339 B1
(45) Date of Patent: May 1, 2001

(54) METHOD AND SYSTEM FOR DETECTING PHASE LOCK IN A PHASE-LOCKED LOOP

(75) Inventors: Chul Nam; A. N. Kourganov, both of Kyonggi-do (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 08/946,193

(22) Filed: Oct. 7, 1997

(30) Foreign Application Priority Data

Oct. 7, 1996 (KR) .................................................. 96/44364

(51) Int. Cl.$^7$ ................................. H03D 3/24; H03L 7/06
(52) U.S. Cl. ........................... 375/376; 327/157; 375/374
(58) Field of Search ..................................... 327/147, 148, 327/150, 155, 157, 159, 156; 375/373, 374, 375, 376; 331/1 R, 18, 25, 1 A

(56) References Cited

U.S. PATENT DOCUMENTS

| | | | |
|---|---|---|---|
| 4,787,097 | * 11/1988 | Rizzo | 375/375 |
| 5,162,746 | * 11/1992 | Ghoshal | 327/159 |
| 5,208,546 | * 5/1993 | Nagaraj et al. | 327/157 |
| 5,479,458 | * 12/1995 | Tanaka | 375/376 |
| 5,577,079 | * 11/1996 | Zenno et al. | 375/373 |

* cited by examiner

Primary Examiner—Stephen Chin
Assistant Examiner—Betsy L. Deppe
(74) Attorney, Agent, or Firm—Sughure, Mion, Zinn, Macpeak & Seas, PLLC

(57) ABSTRACT

A system and method for detecting phase lock in a phase locked loop (PLL) which determines a phase of an oscillating frequency by detecting a phase of a frequency of a voltage controlled oscillator including a multi-detection circuit for generating a locked information signal having N bits by comparing a phase difference between the input reference frequency and the fed-back oscillating frequency to determine a logical up/down signal for charging/discharging during the up/down interval, and when the charge voltage is predicted to equal a reference voltage representing a signal which is K times the reference frequency, for comparing to the set reference frequency in turn to add or subtract from the determined value which is divided by four from the reference frequency, and also includes a current controller for determining input current of a charging pump based on the locked information signal having N bits. As a result, the bandwidth is controlled such that in an unlocked condition, faster tracking is possible, and in a locked condition, phase loss due to jittering and switching can be minimized. Finally, current consumption due the large current input in the charging pump can be significantly reduced.

10 Claims, 3 Drawing Sheets

METHOD AND SYSTEM FOR DETECTING PHASE LOCK IN A PHASE-LOCKED LOOP

BACKGROUND OF THE INVENTION

1. Field of the Invention

The present invention relates to a system for detecting phase lock in a phase locked loop (PLL) which determines a phase of an oscillating frequency by detecting a phase of a frequency of a voltage controlled oscillator, and more particularly, to a detecting method which, based on a phase difference between an input reference frequency and an oscillating frequency, regulates a bandwidth in multiple steps to maintain the oscillating frequency exactly in phase with the input reference frequency. The present invention is based on Korean Application No. 44364/1996, which is incorporated herein by reference.

2. Description of the Related Art

Generally, a PLL system is a feedback loop that is used for extracting a base band signal from a frequency of a carrier wave. The general PLL system essentially includes a phase detector and a voltage controlled oscillator. The phase differences between the incoming carrier signal and an output from the voltage controlled oscillator are compared, and are used to control the frequency of the voltage controlled oscillator. As a result, the output voltage of the phase detector will have the same value as the base band of the incoming signal.

FIG. 1 is a block diagram of a general lock detecting system of a PLL. As illustrated in FIG. 1, a reference frequency ($F_{ref}$) is received through an input terminal 104 of a phase detector 100. An oscillating frequency is fed back to the phase detector 100 which compares a phase difference between the reference frequency ($F_{ref}$) and the oscillating frequency, and generates a phase differential signal. Based on the phase differential signal detected by the phase detector 100, a charging pump 101 controls an amount of current ($I_{pump}$) input to a current input terminal 105 of the charging pump 101. A loop filter 102 generates a DC control voltage after filtering current provided by the charging pump 101. Based on the DC control voltage from the loop filter 102, a voltage controlled oscillator 103 determines an oscillating frequency which is then fed back to the phase detector 100. The oscillating frequency is ultimately output through an output terminal 106 of the voltage controlled oscillator 103.

The general lock detector of a PLL formed in the manner as described above receives a carrier wave which is changed to a reference frequency by input terminal 104, and an oscillating frequency of the voltage controlled oscillator 103. The phase detector 100 compares the phase difference between the two signals.

The following is a detailed description of the voltage controlled oscillator 103. After comparing the phases of the reference frequency and the oscillating frequency, as described above, if the phase of the reference frequency leads the phase of the oscillating frequency output by the voltage controlled oscillator 103, then an "Up" signal, represented as a logical "1", will be output by the phase detector 100 to the charging pump 101. On the other hand, if the phase of the reference frequency lags, then a "Down" signal, which is represented as a logical "0", will be output by the phase detector 100 to the charging pump 101. Based on the "up/down" (1/0) signal transmitted by the phase detector 100, the charging pump 101 controls the amount of current ($I_{pump}$) which is received through the current input terminal 105. The controlled current is then provided to the loop filter 102.

More specifically, if the "Up" signal is received by the charging pump 101 from the phase detector 100, then the input current ($I_{pump}$) will be provided by the charging pump 101 to the loop filter 102 unchanged. However, if the "Down" signal is received, then the input current ($I_{pump}$) will be provided to the loop filter 102 after the input current level is reduced by a certain amount. The loop filter 102 filters the varied input current from the charging pump 101 and generates a corresponding DC control voltage to be sent to the voltage controlled oscillator 103.

Furthermore, the voltage controlled oscillator 103, using the DC control voltage, changes the oscillating frequency to be sent to the phase detector 100, and the oscillating frequency is ultimately output through output terminal 106. Consequently, since the oscillating frequency is controlled by the DC control voltage, a process of tracking starts in order to cause the reference frequency ($R_{ref}$) and the oscillating frequency from the voltage controlled oscillator 103 to be exactly in phase.

In the general system, the locked condition, which occurs when the two frequencies mentioned above are exactly in phase, depends upon a bandwidth of the PLL system. The bandwidth can be controlled sequentially from the phase detector 100 to the voltage controlled oscillator 103, or can be controlled by an output current of the charging pump 101. However, if the PLL system is connected to multiple circuits, then the bandwidth (W) will have a relationship of $W = \sqrt{I_{pump}}$.

Therefore, when the general system contains a wide bandwidth due to a contained current in the charging pump 101, quick tracing is possible, but an ability to block frequency jittering diminishes. On the other hand, when the bandwidth is narrow, quick tracking is difficult, and a locked condition can be easily lost. Moreover, due to a large input current incurred by the charging pump 101, a large amount of voltage is consumed.

SUMMARY OF THE INVENTION

An object of the present invention is to overcome the problems mentioned above by providing a lock detecting system and method of a PLL which controls characteristics of the frequency of the system to ensure faster lock detection and to maximize the impedance of jitter of the frequency.

Another object of the present invention is to provide faster tracking under an unlocked condition, in a case of multiple circuits, by controlling the variability of the bandwidth. Moreover, under a locked condition, a loss in synchronization caused by jittering and switching can be recovered. Furthermore, the present invention provides a simple circuit which facilitates controlling of the variability of the bandwidth for faster tracking.

A final object of the present invention is to reduce voltage consumption due to a large current incurred by the charging pump.

According to a first embodiment of the present invention, a lock detecting system of a PLL, which determines a phase of an output oscillating frequency of the voltage controlled oscillator by detecting a phase difference of the oscillator, includes a multi-detection circuit. A phase detector compares a phase difference between an input reference frequency and the fed-back oscillating frequency to produce an up/down signal. Based on the up/down signal, a charging or discharging process is performed. A charge voltage is compared to a reference voltage representing the frequency of a signal which is is K times the reference frequency, the input reference frequency and the fed-back oscillating frequency then are compared again to produce a value. The produced value subsequently replaces the set value for controlling a value of the oscillating frequency. As a result, an information signal having an N-bit size is created in a locked condition. A current controller is also included in order to use the information signal created by the multi-detection circuit. Based on the information signal, an input current of the charging pump is determined for controlling the bandwidth.

According to a second embodiment of the present invention, a lock detecting device of the PLL, which determines the phase of the oscillating frequency output from the voltage controlled oscillator by detecting a phase difference of the oscillator, includes a multi-detection circuit. The multi-detection circuit compares a phase difference between an input reference frequency and a fed-back oscillating frequency to determine an up/down signal. During an up/down signal interval, either a charging or discharging process is performed. The charge voltage is compared with a predetermined voltage for determining a value which is used as a gauge to determine whether to add or subtract from the determined value. As a result, an information signal having an N-bit size is created in a locked condition. A current controller is also included in order to use the information signal created by the multi-detection circuit. Based on the information signal, an input current of the charging pump is determined in multiple steps for controlling the variability of the bandwidth.

As a result, if the PLL consists a multi-detection circuit, the input current of the charging pump is determined through the multi-detection circuit and the current controller. Consequently, the bandwidth can be controlled such that in an unlocked condition a faster tracking is possible, and in a locked condition a phase loss due to jittering and switching can be minimized. Finally, current consumption due to the large current input to the charging pump can be significantly reduced.

According to another embodiment, a lock detecting method of the PLL, which determines a phase of an output oscillating frequency of a voltage controlled oscillator by detecting a phase difference of the oscillator, includes several steps. First, the phases of the input reference frequency and the fed-back oscillating frequency are compared in order to determine the value of an up/down signal. During the interval for determining the up/down signal, either charging or discharging is performed until the charge voltage value is is predicted to equal a reference voltage representing a signal which is at least four times that of the reference frequency, and these values are compared again. In accordance with the compared value, the value gained by dividing the reference frequency by four is then subtracted. Finally, using the subtracted value, input current of the charging pump is determined to variably control the bandwidth.

DETAILED DESCRIPTION OF THE PREFERRED EMBODIMENT

Figure 1:
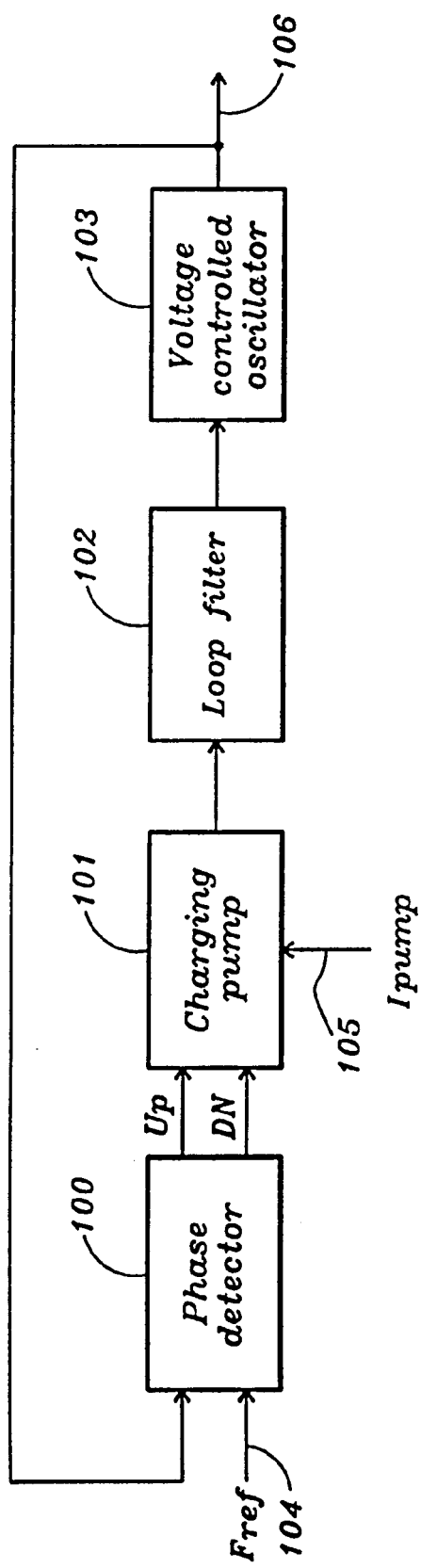
FIG. 1 is a block diagram of a general lock detecting system of a PLL.
Figure 2:
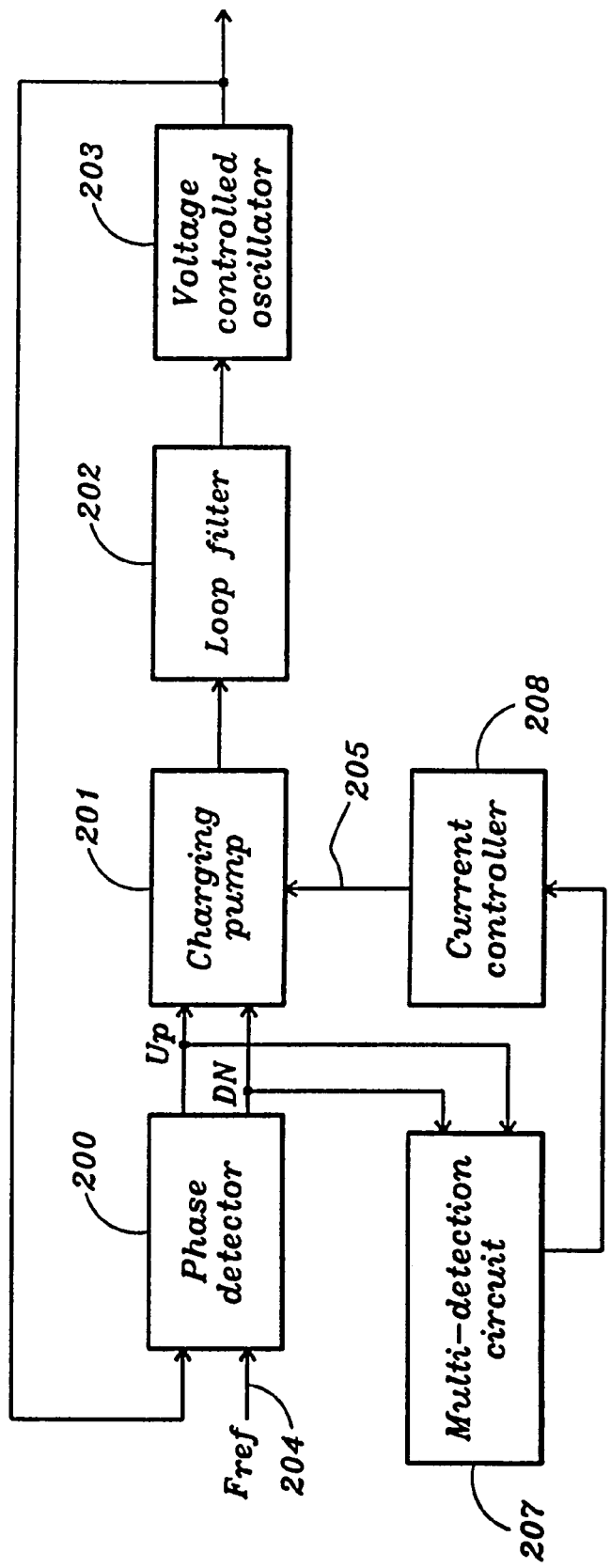
FIG. 2 is a block diagram of a lock detecting system of a PLL according to the present invention.

FIG. 2 is a block diagram of lock detecting system of a PLL according to the present invention. A phase detector 200 compares a phase of the reference frequency ($F_{ref}$), which is changed through the input terminal 204, and that of a fed-back oscillating frequency for generating an up/down signal. A multi-detection circuit 207 performs either a charging or discharging process based on the up/down signal generated by the phase detector 200. After conducting the process until a charge voltage is predicted to equal the reference voltage representing a signal which is four times that of the reference frequency ($F_{ref}$), a comparison is made to determine a value. Afterwards, the value is controlled with respect to the reference frequency ($F_{ref}$) to create a locked information signal having a size of N bits. A current controller 208 determines a pumping input current based on the information signal received from the multi-detection circuit 207, and outputs the current through an output terminal 205. A charging pump 201 regulates the current received from the current controller 208. A loop filter 202 generates a DC control voltage by filtering the current provided by the charging pump 201. A voltage controlled oscillator 203 determines an oscillating frequency, based on the DC control voltage from the loop filter 202, and feeds the oscillating frequency back to the phase detector 200.

The multi-detection circuit 207, as discussed above, includes a control signal generator 300 which is driven by the up/down signal sent from the phase detector 200 to generate a first signal ($T_{ch}$), a second signal ($T_{disch}$), a third signal (SC), and a fourth signal which is the reference frequency ($F_{ref}$) from the input terminal 204 divided by four. A charging/discharging controller 301 is included in the multi-detection circuit 207 for switching a first switch 301b based on the first control signal ($T_{ch}$) to provide a charge current to a charging current member 301a. A second switch 301c is switched based on the second signal ($T_{disch}$) for discharging a current to be sent to a discharging current member 301d. A charging/discharging device 304 changes a value of the charge current based on an input switching signal for further charging before being discharged through the second switch 301c. A bandwidth converting controller 302 adds a clock, which is input four times relative to the reference frequency ($F_{ref}$) based on a charge voltage, to provide a locked information signal having N bits to the current controller 208. Finally, a multiplexer 303 combines the information signals from the bandwidth converting controller 302 for controlling the charging/discharging device 304.

The charging/discharging device 304 includes a switch array 304a which is connected in parallel to the charging and discharging controller 301 to switch the switches S1 through Sm based on the multiplex value output from the multiplexer 303. A capacitor array 304b is included to charge the capacitors C1 through Cm that correspond to the turned-on switches of the switch array 304a.

The bandwidth converting controller 302 includes a comparator 302a which compares the charge voltage from the charging/discharging device 304 and a predetermined reference voltage, for gaining a comparative value to be output. A clock calculating device 302b generates an information signal having N bits in a locked condition by calculating the received clock control signal ($F_{ref}$ divided by 4) based on the comparative value.

When the power of the PLL system is turned off, the control signal generator 300 transmits the third control signal (SC). Based on the third control signal, a discharging switch 305 discharges all charge voltage from the charging/discharging device 304 to reset the system.

Finally, OR gate 306 logically ORs the Up and Down signals generated by the phase detector 200, and provides the results to the control signal generator 300.

A more detailed description of the present invention will now be provided.

Referring to FIG. 2, a phase detector 200 receives both a reference frequency ($F_{ref}$) from an input terminal 204 and a frequency of a voltage controlled oscillator 203, and compares the phases of the two signals. If the phase of the reference frequency ($F_{ref}$) is greater than (leading) that of the oscillating frequency of the voltage controlled oscillator 203, then an "Up" signal having a logical value of "1" will be generated and transmitted to a charging pump 201 and a multi-detection circuit 207. On the other hand, if the phase of the reference frequency is less than (lagging) that of the oscillating frequency, then a "Down" signal having a logical value of "0" will be generated and transmitted to the charging pump 201 and the multi-detection circuit 207.

The multi-detection circuit 207, based on the up/down signal generated from the phase detector 200 along with the reference frequency ($F_{ref}$) provided through the input terminal 204, generates an information signal having N bits in a locked condition. Using this information signal, a current controller 208 determines the input current of the charging pump 201, and in turn the bandwidth of the PLL system is controlled.

Figure 3:
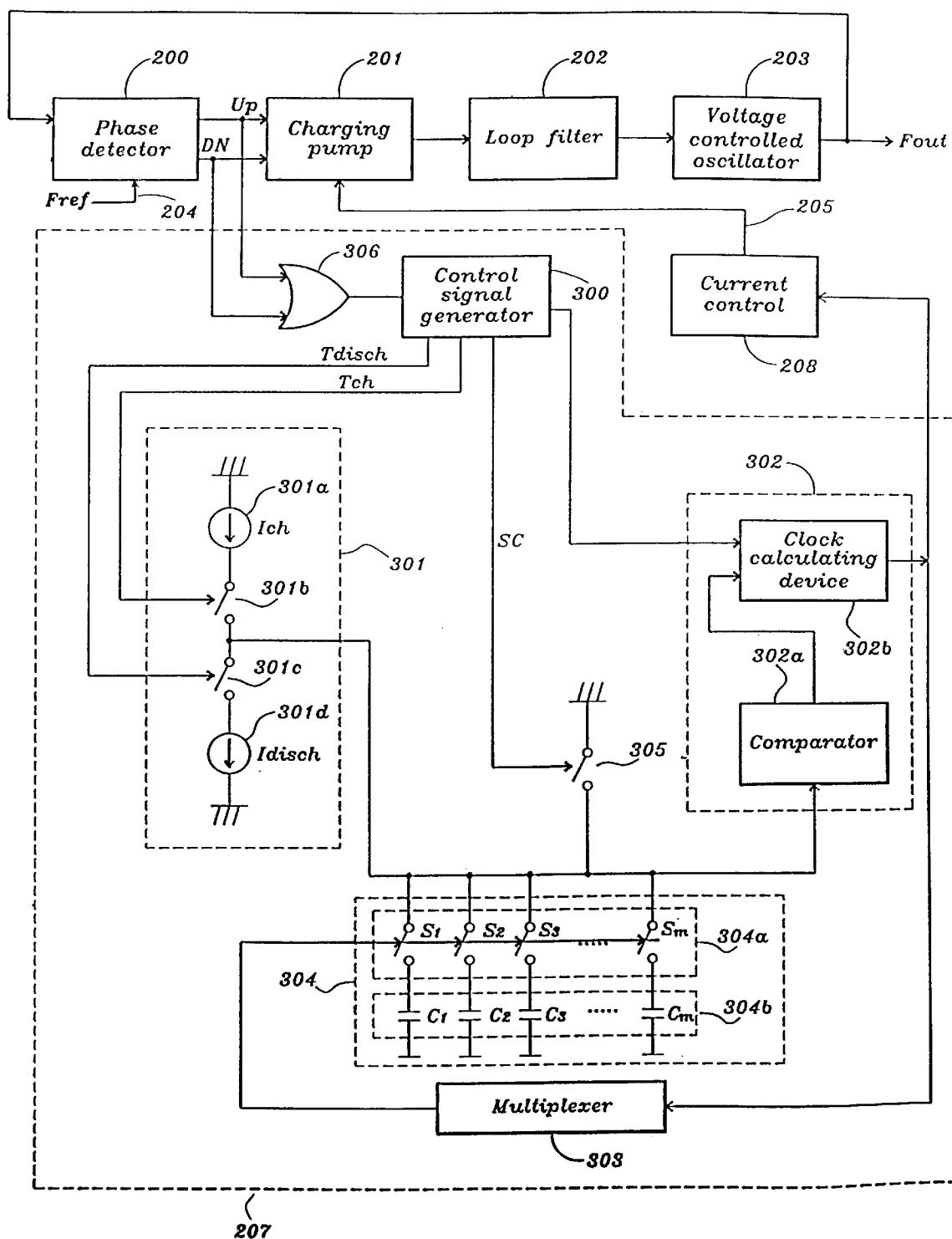
FIG. 3 is a schematic view of the multi-detecting circuit of FIG. 2.

Referring to FIG. 3, a control signal generator 300 of the multi-detection circuit 207 receives an up/down signal which is output by the OR gate 306, and provides the reference frequency ($F_{ref}$) divided by K, which is preferably four, to the bandwidth converting controller 302 as a clock control signal.

Furthermore, the first signal ($T_{ch}$) and the second signal ($T_{disch}$) are generated based on the signal provided through the logical control element 306.

In other words, if a logically significant signal is received from the OR gate 306, then the control signal generator 300 generates the first control signal ($T_{ch}$), which is a charging signal, during an interval for maintaining the signal. However, if a logically insignificant signal is received, then the second control signal, which is a discharging signal, is generated.

As mentioned above, if the phase of the reference frequency ($F_{ref}$) is determined to be greater than that of the voltage controlled oscillator 203, then the control signal generator 300 generates the first control signal ($T_{ch}$), which is a charging signal, upon receiving a logically significant signal from OR gate 306. Ultimately, the charging/discharging device 304 charges a current charged by means of the first switch 301b of the charging controller 301, based on the charging signal.

On the other hand, if the phase of the reference frequency ($F_{ref}$) is determined to be less than that of the voltage controlled oscillator 203, then the control signal generator 300 generates the second control signal ($T_{disch}$), which is a discharging signal, upon receiving a logically insignificant signal from OR gate 306. As a result, the charge current from the charging/discharging device 304 is discharged.

The first switch 301b and the second switch 301c are never closed or open simultaneously. If either of the two switches is closed, the other switch is open. Therefore, when the first switch 301b of the charging/discharging device 304 is closed, the second switch 301c is opened. As a result, during the interval of the first control signal ($T_{ch}$), a current provided by the charging current member 301a is charged to one of the corresponding capacitors C1 through Cm of the capacitor array 304b which is linearly connected to one of the charging switches S1 through Sm of the switch array 304a selected by the multiplexer 303 to be described later.

Moreover, when the second switch 301c of the charging/discharging controller 301 is closed, the first switch 301b is open. As a result, the current charged through one of the corresponding capacitors C1 through Cm is slowly discharged by means of the corresponding switch of the switch array 304a and the discharging current member 301d during the interval ($T_{disch}$) of the second switch 301c.

In order to maintain a locked condition, the multiplexer 303 combines calculated values of the information signals, which are periodically sent from the clock calculating device 302b of the bandwidth converting controller 302. Afterwards, as mentioned above, the multiplexer 303 selectively switches only the corresponding switches S1 through Sm for controlling the charge voltage of the charging/discharging device 304, which will be provided to the comparator 302a.

The charge voltage can be described using the following mathematical formula:

$$Vi1 = T_{ch} \times I_{ch} / Ci \qquad \text{[Mathematical Formula 1]}$$

In Mathematical Formula 1, $T_{ch}$ represents a high cycle interval of the signal output by the logical OR gate 306; Ci represents an equivalent capacitance of a capacitor of the capacitor array 304b selected by the multiplexer 303; and $I_{ch}$ represents a charge current of the selected capacitor.

The charge voltage can also be described in a mathematical formula:

$$Vi2 = -T_{disch} \times I_{disch} / Ci \qquad \text{[Mathematical Formula 2]}$$

In Mathematical Formula 2, $T_{disch}$ represents a low cycle interval of the signal output by the logical OR gate 306; Ci represents the equivalent capacitance of a capacitor of the capacitor array 304b selected by the multiplexer 303; and $I_{disch}$ represents a discharge current of the selected capacitor.

In other words, the current charged to an m number of capacitors (C1 through Cm) of the charging/discharging device 304 creates a charge voltage which is provided to the comparator (302a) of bandwidth converting controller 302 through the corresponding switch (S1 through Sm) selected by the multiplexer 303.

The bandwidth converting controller 302, based on the charge voltage provided by the charging/discharging device 304, adds the output of the comparator and a clock control signal which is input after being divided by K, or more specifically, four times with respect to the reference frequency ($F_{ref}$), to create a locked information signal having N bits.

The bandwidth converting controller 302 includes a comparator 302a which compares a charge voltage with a fixed predetermined (reference) voltage which represents the desired frequency of the clock control signal, and a clock calculating device 302b which calculates a value from the clock control signal sent from the control signal generator 300, based on the compared value.

Consequently, in order to maintain the charge voltage in the capacitor array 304b and the locked condition, when the reference frequency ($F_{ref}$) should be divided by K or preferably by four, the comparator 302a compares the value of the reference voltage and the charge voltage. If the predetermined voltage is higher, then a logical low signal is provided to the clock calculating device 302b. On the other hand, if the charge voltage is higher, then a logical high signal will be provided to the clock calculating device 302b.

The reason for performing the comparing operation when the reference voltage represents four times the reference frequency ($F_{ref}$), is to match the phase with the clock from the control signal generator 300.

When the signal from the comparator 302a is high (i.e., when the phase of the oscillating frequency and that of the changed reference frequency ($F_{ref}$) are unequal thereby causing an unlocked condition), the clock calculating device 302b increments the clock control signal from the control signal generator 300. As a result, an unlocked information signal having N bits is provided to the current controller 208 and the multiplexer 303.

When the signal from the comparator 302a is low (i.e, when the phase of the oscillating frequency and that of the changed reference frequency ($F_{ref}$) are equal thereby causing a locked condition), the clock calculating device 302b decrements the clock control signal from the control signal generator 300. As a result, an unlocked information signal having N bits is provided to the current controller 208 and to the multiplexer 303 for controlling the changing switch of the charging/discharging device 304.

More particularly, when the clock calculating device 302b sends the unlocked information signal having N bits, the multiplexer, which will be described further below, controls the changing switch array 304a for providing charge current to the capacitors and a resulting charge voltage to the comparator 302a. Therefore, the clock calculating device 302b corresponding to the charge voltage increments the clock for increasing an input current of the charging pump 201.

Furthermore, in an unlocked condition, or when the calculated value is increased by the clock calculating device 302b to be input, the current controller 208 increases the bandwidth of the phase locked loop system in order increase the current input to the charging pump 201. On the other hand, in a locked condition, or when the calculated value is decreased by the clock calculating device 302b to be input, the current controller 208 deceases bandwidth of the phase locked loop system in order to decrease the current input to the charging pump 201.

Consequently, in the unlocked condition, due to the increase in the bandwidth, a quick tracking becomes possible. Moreover, in the locked condition, due to the decrease in the bandwidth, not only can the noise be eliminated, but also the power consumption caused by high current flow to the charge pump 201 can be reduced.

Referring to FIG. 3, the reference numeral 305 represents a discharging switch. When the power of the phase locked loop system is turned off, due the characteristics of the capacitance of the capacitor array 304b, charging is very fast and discharging is very slow. Therefore, even if the second switch 301c is closed, the current charged by the capacitor array 304b will not be fully discharged. Consequently, when the power is turned off, the third control signal (SC) provided by the control signal generator 300 causes the discharging switch 305 to be closed. As a result, the charge current in the capacitor array 304b is quickly discharged.

As mentioned above, in the phase locked loop system according to the present invention, even if the system is made up of multiple systems, the multi-detection circuit 207 and the current controller 208 determine an input current of the corresponding charging pump 201. Therefore, since a bandwidth can be controlled, in the locked condition, a quick tracking can be made. In the unlocked condition, jitter effect and phase loss during switching can be reduced. Moreover, the power consumption caused by the input of the large current from the charging pump 201 can also be reduced.

Although a specified system according to the present invention has been described and illustrated herein, it is apparent that those who are skilled in the art can easily make modifications thereto. Therefore, it should be understood that the present invention is not limited to the disclosed embodiments, and is intended to cover various modifications and arrangements included within the spirit and scope of the following claims.

What is claimed is:

1. A system for detecting phase lock in a phase-locked loop by detecting a phase difference between an input reference frequency and a fed-back oscillating frequency of a voltage controlled oscillator for determining a phase of a modulating frequency output by said voltage controlled oscillator, comprising:
   a) a phase detector for comparing the phase difference between said input reference frequency and said fed-back oscillating frequency, and for determining a logical up/down signal based on said comparison;
   b) a multi-detection circuit for performing charging/discharging according to said logical up/down signal until a charge voltage is predicted to equal a predetermined voltage representing a clock signal which is K times the input reference frequency, for performing a comparison between the predetermined voltage and the charge voltage, and for creating a locked information signal having N bits, where K is an even whole number and N is an whole number greater than 1, said multi-detection circuit comprising;
      1) a control signal generator for generating one of a group of first, second, and third control signals based on the up/down signal, and for generating a fourth control signal by dividing the input reference frequency by K;
      2) a charging/discharging controller for selectively turning on switches based on said first and second control signals generated by said control signal generator for controlling charging/discharging of a charge current;
      3) a charging/discharging device for selectively charging the charge current provided by said charging/discharging controller according to said locked information signal having N bits, and discharging the charge current by means of said charging/discharging controller;
      4) a bandwidth converting controller for adding a clock which is K times the reference frequency received from said control signal generator to said locked information signal having N bits, and providing the result to a current controller; and
      5) a multiplexer for combining locked information signals for selectively controlling said charging/discharging controller;
   c) a charging pump; and
   d) the current controller for determining an input current of the charging pump based on said locked information signal from said multi-detection circuit in order to change a bandwidth of said system.

2. The system for detecting phase lock in a phase-locked loop according to claim 1, wherein said charging/discharging controller comprises:
   a) a first switch for switching according to said first control signal generated by said control signal generator, and for providing the charge current; and
   b) a second switch for switching according to said second control signal generated by said control signal generator, and for discharging the charge current from said charging/discharging device.

3. The system for detecting phase lock in a phase-locked loop according to claim 1, wherein said charging/discharging device comprises:

a) a switch array having switches which are selectively switched based on the locked information signal having N bits provided by said multiplexer; and b) a capacitor array having capacitors which are respectively connected to said switches of said switch array for charging the charge current.

4. The system for detecting phase lock in a phase-locked loop according to claim 3, wherein a number of switches in said switch array corresponds to said N bits.

5. The system for detecting phase lock in a phase-locked loop according to claim 3, wherein a charge voltage ($\Delta v1$) of said charging/discharging device is characterized as $\Delta v1 = Tch \times Ich/Ci$, where Tch represents a high interval time of said up/down signal, Ci represents an equivalent capacitance of a selected capacitor of said capacitor array, and Ich represents the charge current in the selected capacitor.

6. The system for detecting phase lock in a phase-locked loop according to claim 3, wherein a discharge voltage ($\Delta v2$) of said charging/discharging device is characterized as $\Delta v2 = Tdisch \times Idisch/Ci$, where Tdisch represents a low interval time of said up/down signal, Ci represents an equivalent capacitance of a selected capacitor of said capacitor array, and Idisch represents the discharge current in the selected capacitor.

7. The system for detecting phase lock in a phase-locked loop according to claim 1, wherein said bandwidth converting controller comprises:

a) a comparator for comparing the charge voltage of said charging/discharging device with said predetermined voltage; and b) a clock calculator for up/down counting the clock provided by said control signal generator for generating the locked information signal having N bits.

8. The system for detecting phase lock in a phase-locked loop according to claim 1, wherein a discharge switch is closed and the charge current is quickly discharged thereby according to said third control signal when system power is turned off.

9. The system for detecting phase lock in a phase-locked loop according to claim 1, wherein a charge voltage ($\Delta v1$) of said charging/discharging device is characterized as $\Delta v1 = Tch \times Ich/Ci$, where Tch represents a high interval time of said up/down signal, Ci represents an equivalent capacitance of a selected capacitor of said capacitor array, and Ich represents the charge current in the selected capacitor.

10. The system for detecting phase lock in a phase-locked loop according to claim 1, wherein a discharge voltage ($\Delta v2$) of said charging/discharging device is characterized as $\Delta v2 = Tdisch \times Idisch/Ci$, where Tdisch represents a low interval time of said up/down signal, Ci represents an equivalent capacitance of a selected capacitor of said capacitor array, and Idisch represents the discharge current in the selected capacitor.

* * * * *